United States Patent [19]

Krautschneider et al.

[11] Patent Number: 5,333,093
[45] Date of Patent: Jul. 26, 1994

[54] PROTECTION APPARATUS FOR SERIES PASS MOSFETS

[75] Inventors: Wolfgang H. Krautschneider; Mike A. Killian, both of Burlington, Vt.

[73] Assignee: Siemens Aktiengesellschaft, Munich, Fed. Rep. of Germany

[21] Appl. No.: 788,642

[22] Filed: Nov. 6, 1991

[51] Int. Cl.$^5$ .......................... H02H 9/00; H03K 5/08
[52] U.S. Cl. ...................................... 361/56; 307/568; 361/91
[58] Field of Search ...................... 361/56, 86, 88, 91, 361/111; 307/568, 573; 257/355, 357

[56] References Cited

U.S. PATENT DOCUMENTS

| | | | |
|---|---|---|---|
| 3,819,952 | 6/1974 | Enomoto et al. | 307/202 |
| 4,005,342 | 1/1977 | Davis | 317/16 |
| 4,061,928 | 12/1977 | Kessler | 307/200 B |
| 4,295,176 | 10/1981 | Wittwer | 361/91 |
| 4,481,521 | 11/1984 | Okumura | 357/23 |
| 4,527,213 | 7/1985 | Ariizumi | 361/56 |
| 4,930,037 | 5/1990 | Woo | 361/58 |

*Primary Examiner*—A. D. Pellinen
*Assistant Examiner*—Ronald W. Leja
*Attorney, Agent, or Firm*—Adel A. Ahmed

[57] ABSTRACT

In order to restrict the voltage across the gate oxide of an input pass-through transistor which operates as an input signal source to a MOS inverter, a MOS transistor wired as a MOS diode is connected between the source and gate electrode of the pass-through transistor. The diode connected transistor allows the use of a thin oxide device for the pass-through transistor which enables a high transconductance device to be employed while restricting the voltage across the gate oxide of the pass-through transistor to an acceptable value.

15 Claims, 1 Drawing Sheet

M1: $V_b = V_{dd}$
$V_{GSM1} = V_{TM2}$ IF $V_{in} > V_{dd}$

PROTECTION APPARATUS FOR SERIES PASS MOSFETS

FIELD OF THE INVENTION

This relates to metal oxide semiconductor field effect transistors (MOSFETs) and, more particularly, to protection apparatus which operates to restrict the voltage across the gate oxide of an input series pass MOSFET to a level which will not cause destruction of the gate oxide.

BACKGROUND OF THE INVENTION

MOS transistors or the MOSFET are well known. These transistors basically consist of a bar of doped silicon or some other substrate material that acts like a resistor. The terminal into which current is injected is called the source. The source terminal is similar in function to the cathode of a vacuum tube. The opposite terminal is called the drain terminal and can be likened to a vacuum tube plate. In a MOSFET, the polarity of the voltage applied to the drain and source can be changed. The gate electrode basically consists of a conductive area which is overlaid on the oxide covering the entire channel region. The conductive area of the gate in conjunction with the insulating oxide layer and the semiconductor channel forms a capacitor. Hence, by controlling the voltage on the gate electrode, one can control the current flowing between the source and the drain electrodes. Drain current flow is enhanced by the gate voltage and can be controlled or modulated by it. The channel resistance is directly related to the gate voltage. These operations are well known. It is possible to make a MOSFET with a P or N channel by reversing material conductivity types and it is also possible to form both P and N channel MOSFETs on the same substrate. This results in the complementary COS/MOS or CMOS types used in digital circuits.

As indicated, many variations of MOS devices exist. A difficulty which the prior art was well aware of concerning MOS devices relates to the protection of such devices. The prior art was aware of the fact that electrostatic discharges occur when an MOS device is picked up by its case and the handler's body capacitance to ground is discharged to ground through the series arrangements of the bulk-to-channel and channel-to-gate capacitances of the device. This applies to both discrete MOSFETs and complementary MOS ICs. Thus, the prior art taught one to handle such devices fairly carefully to prevent such damage. In any event, because of the static discharge problem, certain manufacturers provided some form of protection for a number of MOS devices. Generally, this protection takes the form of a diode incorporated as part of the substrate material.

By way of background illustration, the gate voltage handling capability of prior art MOS devices is between 30 volts and about 100 volts. Such voltages will not result in breakdown. However, with any MOS device, once the oxide insulation breaks down, the device is usually destroyed. Thus the prior art used a diode in parallel with the input capacitance and this method was employed in single gate MOS devices but had limitations in terms of signal handling as the single diode clips the positive peaks of a sine wave when the device is operated at near zero bias.

The use of a diode, as well as back-to-back diodes, was employed with MOS devices to prevent oxide breakdown for large voltages. The diodes were fabricated by forming a PN junction as part of the monolith chip. This protection scheme was used by many companies, such as Motorola, RCA, and so on in complementary MOS devices. Such protection circuits are well known. See, for example, a text entitled "Manual for MOS Users" by John D. Lenk, published by Reston Publishing Company, Inc. (1975). See also U.S. Pat. No. 4,061,928 entitled CIRCUIT ARRANGEMENT FOR THE PROTECTION OF INPUTS OF INTEGRATED MOS CIRCUITS, issued on Dec. 6, 1977 to H. H. Kessler and assigned to Siemens Aktiengesellschaft. This patent describes a circuit arrangement for the protection of inputs of integrated MOS circuits against excessive voltages which may occur due to static charges. The circuit includes a first circuit connected to the MOS circuit and having two bypass circuits reacting at different input voltages, and having a high-ohmic compensating resistance. A second circuit is connected ahead of the first circuit and includes a bypass circuit and another high-ohmic compensating resistance. The circuit combination operates to protect the input to an inverter stage utilizing a MOSFET as an input transistor and another MOSFET as a load transistor.

U.S. Pat. No. 4,527,213, issued on Jul. 2, 1985, entitled SEMICONDUCTOR INTEGRATED CIRCUIT DEVICE WITH CIRCUITS FOR PROTECTING AN INPUT SECTION AGAINST AN EXTERNAL SURGE to S. Ariizumi. This patent shows a protection circuit for an MOS circuit which includes an input terminal having a first resistor connected at one end to the input terminal and a first protective circuit connected between the other end of the first resistor and a reference voltage source for accelerating the discharge of an input surge. The first protective circuit includes a first MOS transistor and a resistor connected in series to the source-drain path of the first transistor. The first transistor is wired as a diode having its gate electrode connected to the drain electrode, with a second circuit also connected as a diode having its gate electrode connected to the drain electrode, whereby the first and second circuits are separated by a resistor which is used to protect the MOS transistors with regard to large potentials.

See also U.S. Pat. No. 3,819,952 entitled SEMICONDUCTOR DEVICE, issued on Jun. 25, 1974 to T. Enomoto et al. This patent shows a first protected insulated gate field effect transistor having a drain and a source connected respectively to a gate and source of an FET to be protected against overvoltages, with the gate connected to an input through a resistor. A second protecting FET transistor, higher in threshold voltage than the first transistor, has a source connected to the gate of the first transistor and through another resistor to the source of the same transistor with its gate and drain coupled to the input. The second protecting transistor conducts in response to an overvoltage applied to the input to decrease the voltage applied to the protected transistor and to cause conduction of the first transistor. The conduction of the first transistor causes a voltage at a decreased level to be applied to the protected transistor. The circuit schematic is shown in FIGS. 2, 3, and 4 where field effect transistors are shown with the gate and sources connected together as a diode.

See also U.S. Pat. No. 4,481,521 entitled INSULATED GATE FIELD EFFECT TRANSISTOR PROVIDED WITH A PROTECTIVE DEVICE FOR A GATE INSULATING FILM, issued on Nov. 6, 1984 to K. Okumura. This patent shows an improved protective device for the gate insulation of an integrated gate field effect transistor (IGFET) that does not break down under spike-like input voltages. The protective device is formed on the same semiconductor chip as an operative IGFET and includes a resistor connected between the input terminal and the operative IGFET's gate. The protection IGFET has the drain and gate both connected to the operative IGFET's gate, and another resistor connected between the protection IGFET's source and a constant voltage source completes the circuit.

The above patents and prior art have been cited to acknowledge the fact that there are many prior art disclosures which relate to protection devices and circuits for protecting the gate insulating film to extend the life of the protected field effect device. The prior art is aware that an improved electrical performance of an FET can be had by decreasing the threshold voltage and increasing the voltage gain by making the gate insulating film thinner. However, if the gate insulating film is made thinner, the dielectric breakdown voltage of the gate insulating film is lowered. Thus, it is desirable to keep the gate insulating film as thin as possible but to also provide protection so that the thin gate insulating film is not destroyed during a device over voltage.

There is a particular problem which involves a series pass-through MOSFET which is employed in many MOS circuit configurations. In many system configurations which utilize series pass-through MOSFETs, the circuits employ two different voltages which are supplied from different power supplies. For example, in such a system one may use a 3.3 volt and a 5 volt supply for biasing and providing logic levels. The 3.3 volt power source may not necessarily be on when the 5 volt supply is turned on. This can occur during "Power On" for a short period of time or due to a malfunction of one supply as the lower voltage supply for any given period of time. In this case, the input/output circuits of the 3.3 volt circuit components are biased with 5.5 volts which can cause, in the case of thin gate oxides (those having thicknesses of 10 nm or below), a severe oxide stress with related damage. Prior art techniques do not address themselves to the protection of a MOSFET used as a series pass-through device. Furthermore, one requires a thin oxide and if the oxide were made thicker to avoid the problem, then the device would exhibit lower transconductance leading to decreased circuit performance.

As will be further explained, the present invention allows the use of a thin oxide device with high transconductance in the input/output circuitry in conjunction with a series pass or a pass-through MOSFET.

SUMMARY OF THE INVENTION

A protection apparatus for protecting the input of a series pass-through FET transistor from excessive voltages applied to an input source or drain terminal electrode of said FET, where the source to drain path of said FET is connected between an input terminal and output terminal, comprising a protection FET transistor connected as a FET diode with the diode connected between said input drain or source terminal and said gate electrode of said pass-through transistor and poled to conduct when the voltage at said input terminal exceeds a given predetermined level.

BRIEF DESCRIPTION OF THE FIGURE

The sole Figure is a detailed circuit schematic showing the invention herein.

DETAILED DESCRIPTION OF THE INVENTION

Figure 1:
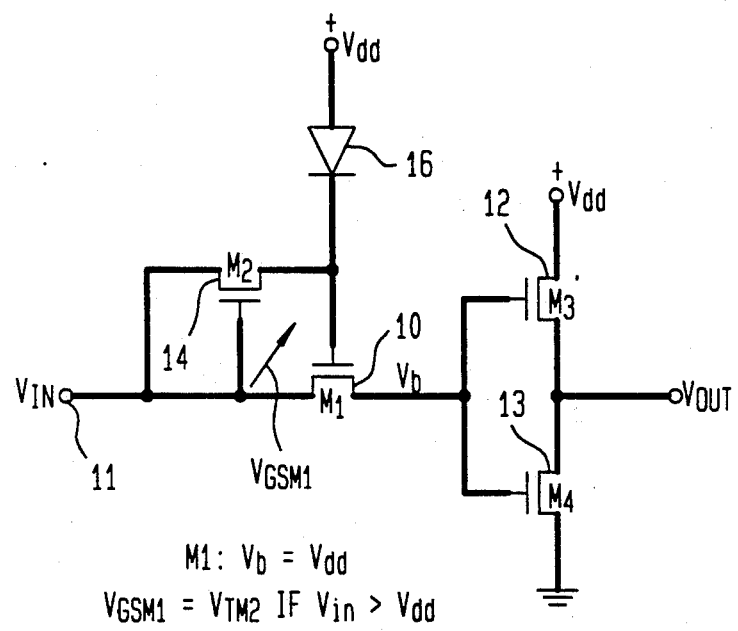

Referring to the Figure, there is shown a series pass or a pass-through FET transistor 10. The transistor 10 is a MOSFET. The MOSFET 10 has the source electrode connected to an input pad or terminal 11 designated as Vin. The drain electrode of MOSFET 10 is coupled to the input terminal of a CMOS inverter consisting of transistors 12 and 13, also designated as M3 and M4. The inverter, including transistors 12 and 13, is a well known and standard circuit which is widely employed in FET technology and is utilized as an input buffer or other device. Basically, practically all MOS devices used in digital circuits are some form of complementary inverter. The basic circuit employs a P channel and N channel device formed on a common substrate or chip. The source electrode of the P channel device is connected to the supply voltage (+Vdd) with the source electrode of the N channel device 13 connected to a point of reference potential or ground. The gate electrodes of both channels are tied together and represent the input designated as $V_b$. The output is taken from the connection between the drain electrodes of the P channel device 12 and the N channel device 13 and is designated as Vout. Thus the inverter shown in the Figure is a very typical and well known inverter and normally operates with logic levels where usually a $+V_b$ is a binary 1 and a ground or a zero at $V_b$ is a binary 0. With a sufficiently positive input, the P channel section of the substrate has a zero gate voltage and is essentially cut off. The P channel device 12 conducts very little drain current for a FET device and, for example, typically a few picoamperes of leakage current for an enhancement MOSFET. The N channel device 13 or the N channel section of the chip becomes conductive and its drain voltage is near ground or zero. The load capacitance at the output represents the output load plus any stray capacitance. With ground potential at the input, the N channel device 13 is cut off and permits only a small amount of leakage drain current to flow. The P channel element becomes conductive, thus making the P channel drain at some voltage near +Vdd. Thus, as one can see, no matter which logic signal is applied at the input or appears at the output, the power dissipation of the inverter is extremely low. This is because both stable states as a 1 or 0 are conducting only a few picoamperes of leakage current, since both channels are in series and one channel is always cut off except very briefly during transition between logic states. Power is dissipated only during switching, making this an ideal situation for logic circuits.

As one can ascertain, the input to the inverter designated as $V_b$ is supplied through the series pass MOSFET 10. The MOSFET 10 has a MOSFET 14 (M2) connected as a diode with the drain or source connected to the gate, this diode being connected between the source and gate electrode of the FET 10. The MOSFET 14 has its gate electrode connected to its source or drain electrode to form a diode. Also connected to the gate electrode of FET 10 is a pn diode 16 having its anode electrode coupled to the +Vdd supply with its cathode electrode coupled to the gate electrode of MOSFET 10. An input voltage (Vin) is normally applied at the input terminal 11, which input terminal is connected to the source electrode of the pass-through transistor 10. This voltage causes a voltage drop across the gate oxide of the pass-through transistor 10 which is the difference between the voltage applied to the input terminal 11 and the gate voltage of the pass-through device 10. In order to restrict the oxide voltage to an acceptable value, the MOS transistor 14 is wired as an MOS diode and is connected between the source electrode and gate electrode of the FET device 10. This MOS diode 14 turns on when the voltage across the oxide of the pass-through device 10 exceeds the threshold voltage of the MOS diode 14. In this manner the oxide voltage is limited to an uncritical value for any externally applied voltage or gate voltage of the pass-through device 10. The pn diode 16 is biased in the forward direction from the +Vdd supply to the gate electrode of the pass-through device 10 and operates to suppress leakage current flow from the output via the MOS diode 14 to the +Vdd supply. This action occurs in case of output voltages which are greater than Vdd.

As indicated above, a problem solved by the circuit is as follows. In a system which uses 3.3 volts and 5 volt circuits supplied from different power sources, the 3.3 volt power source may not necessarily be on when the 5 volt supply is turned on. This can occur during Power On for a short period of time or can occur for large periods of time due to a malfunction of the 3.3 volt source. In this case, the input/output circuits of the 3.3 volt components are biased with 5.5 volts (worst case) which can cause, in the case of thin gate oxides, for example, 5-25 nm, or thereabouts, a severe stress with consequent damage to the device. Thus in order to protect the gate oxides of the input/output pass-through device 10, the MOS diode 14 is connected between the input/output pad as terminal 11 and the gate electrode of the pass-through MOSFET 10. Thus one can utilize pass-through devices having extremely thin gate oxides and therefore having high transconductance while assuring that the devices will not fail, based on the fact that the voltage across the gate oxide is restricted in value due to the presence of the MOS diode which is connected between the source and gate electrode of the pass-through MOSFET.

Thus as one can ascertain, the above-noted invention enables the use of thin oxide devices for pass-through circuits. As shown basically in the Figure, the voltage designated as VGS (M1) is the voltage between the gate and source electrode of the pass-through transistor 10 and is equal to the MOS diode threshold voltage (VTM2) when the voltage at terminal 11 (Vin) is greater than the operating potential (+Vdd).

Although this invention has been illustrated and described in relation to a specific exemplary embodiment, those skilled in the art will readily recognize that variations in the arrangement of parts may be made to suit specific requirements without departing from the spirit and scope of the invention. Thus, for example, diode 16 is shown in the illustrative embodiment as a PN junction diode, whereas it could be implemented as a MOSFET diode, for example, or as a Schottky diode.

We claim:

1. A protection apparatus for protecting the input of a series pass-through FET transistor from excessive voltages applied to the input source or drain terminal electrode of the FET where the source to drain path of said FET transistor is connected between an input terminal and output terminal, comprising:

a protection FET transistor connected as a FET diode and with said diode connected between said input drain or source terminal and said gate electrode of said pass-through transistor.

2. The protection apparatus according to claim 1, wherein said FETs are MOSFETs.

3. The protection apparatus according to claim 2, further including a diode having a cathode electrode coupled to said gate electrode of said pass-through FET and an anode electrode coupled to said source of operating potential and operative to suppress leakage current flow.

4. The protection apparatus according to claim 3, wherein said diode is a PN diode.

5. The protection apparatus according to claim 2, wherein the gate oxides of said pass-through MOSFET is approximately 10 nm thick.

6. The protection apparatus according to claim 1, wherein said FET diode turns on when the voltage across the gate electrode of said pass-through FET exceeds the threshold voltage (VT) of said FET diode.

7. The protection circuit according to claim 6, wherein the voltage at the gate electrode of said pass-through FET is the voltage across the oxide of an MOS pass-through FET, whereby the oxide voltage is limited to a value below the gate oxide breakdown.

8. A protection apparatus for protecting the input of a series pass-through FET transistor from excessive voltages applied to the input source or drain terminal electrode of the FET where the source to drain path of said FET transistor is connected between an input terminal and output terminal, comprising:

a protection FET transistor connected as a FET diode and with said diode connected between said input drain or source terminal and said gate electrode of said pass-through transistor; and an inverter including a P and an N channel FET each having a source, drain and gate electrode, with the source electrode of said P channel FET coupled to a source of operating potential, with the drain electrodes of said P and N channel FETs coupled together to an output, with the source electrode of said N channel FET coupled to a point of reference potential, and with the gate electrodes of said N and P channel FETs connected together and coupled to said drain electrode of said pass-through FET.

9. The protection apparatus according to claim 8, wherein said P channel and N channel FETs are MOSFETs.

10. A protection circuit for a MOS pass-through FET, comprising:

a CMOS inverter having a P channel and an N channel MOSFET, each having a drain, source and gate electrode, with the source electrode of said P channel FET adapted to be connected to a source of operating potential, with the drain electrodes of said P and N channel FETs connected together to provide an output terminal with the source electrode of said N channel FET connected to a point of reference potential, and with the gate electrodes of said N and P channel FETs connected together to form an input terminal, a series pass-through MOSFET having a source drain and gate electrode and having the source electrode connected to an input terminal pad for receiving input signals, and having the drain electrode connected to the input terminal of said inverter, and having a gate electrode coupled to said source of operating potential, and a protection MOSFET transistor having a source, drain and gate electrode and connected as a diode with the common source gate electrode connection of said protection MOSFET connected to the source electrode of said series MOSFET and with the drain electrode of said protection MOSFET connected to the gate electrode of said series MOSFET, whereby when a voltage at said input terminal pad exceeds said operating potential voltage, said protection MOS conducts to limit the voltage (VGS) applied to the gate oxide of said pass-through MOSFET.

11. The protection circuit according to claim 10, further including a unidirectional current conducting device having one terminal connected to the gate electrode of said series pass MOSFET, and the other terminal connected to said point of operating potential and operative to suppress the flow of leakage current.

12. The protection apparatus according to claim 11, wherein said unilateral current conducting device is a diode having a cathode electrode connected to said gate electrode of said series pass MOSFET and an anode electrode connected to said source of operating potential.

13. The protection apparatus according to claim 12, wherein said diode is a PN diode.

14. The protection apparatus according to claim 13, wherein said gate oxide of said series pass MOSFET approximately 10 nm thick.

15. The protection apparatus according to claim 13, wherein said inverter, said series pass MOSFET, said protection MOSFET and said PN diode are formed on the same substrate.

* * * * *